United States Patent [19]

Barozzi

[11] Patent Number: 5,069,195
[45] Date of Patent: Dec. 3, 1991

[54] APPARATUS FOR AUTOMATIC SEPARATION ALONG PREDETERMINED BENDING FRACTURE LINES IN BASIC CERAMIC PLATELETS OF HYBRID ELECTRONIC CIRCUITS

[75] Inventor: Gian P. Barozzi, Cremona, Italy
[73] Assignee: AISA S.P.A., Cremona, Italy
[21] Appl. No.: 365,458
[22] Filed: Jun. 13, 1989
[30] Foreign Application Priority Data Jun. 16, 1988 [IT]  Italy ................................ 20991 A/88

[51] Int. Cl.⁵ .............................................. B26F 3/00
[52] U.S. Cl. .................................. 125/23.01; 225/96.5; 225/97; 225/103
[58] Field of Search ............... 225/96.5, 97, 103, 2; 125/23 R, 35, 23.01, 23.02

[56] References Cited
U.S. PATENT DOCUMENTS 4,371,103  2/1983  Siemens et al. ............... 225/96.5 X
4,516,712  5/1985  Whalley ......................... 225/96.5
4,646,955  3/1987  Garrick ......................... 225/96.5 X
4,834,275  5/1989  Kittel ............................ 225/96.5 X
4,865,241  9/1989  Hamel ........................... 225/96.5 X Primary Examiner—Frank T. Yost
Assistant Examiner—Rinaldi Rada
Attorney, Agent, or Firm—Herbert Dubno; Yuri Kateschov

[57] ABSTRACT

An apparatus for the automatic separation along predetermined bending fracture lines in basic ceramic platelets of hybrid electronic circuits includes a support plate provided with grooves on its lower face defining bending lines juxtaposed with the fracture lines of the platelet urged against an upper face of plate by upper pressing members being in contact with each of single elements of the platelet defined by the fracture lines and lower retractable members controlled in a predetermined sequence for successive bending of the plate and the platelet subdivided in a plurality of single elements.

12 Claims, 3 Drawing Sheets

APPARATUS FOR AUTOMATIC SEPARATION ALONG PREDETERMINED BENDING FRACTURE LINES IN BASIC CERAMIC PLATELETS OF HYBRID ELECTRONIC CIRCUITS

FIELD OF THE INVENTION

The present invention relates to an apparatus for the automatic separation along predetermined bending fracture lines in basic ceramic platelets of hybrid electronic circuits.

BACKGROUND OF THE INVENTION

For the construction of electronic apparatuses of various types, electronic circuits known as "hybrid" circuits are used, which are composed of a platelet of ceramic material or the like, on which some components of the circuit and corresponding connections are formed by various technigques, while other components are applied above the circuit. Such circuits are usually constructed on basic platelets of relatively large dimensions, on which several single circuits are arranged in several parallel rows. At the end of the processing, the single elements corresponding to each circuit are separated along the respective boundary lines by bending in correspondence with incisions into the thickness of the platelet which are predetermined for this purpose.

Such operations may be carried out by hand or by means of simple devices clamping an element and bending the adjacent element. However, in these cases it is possible that the fracture may not take place along the predetermined lines but, as a result of anisotropy of the material and, in particular, as a result of lack of support at a rigid, straight abutment of the elements of the platelet in proximity to the fracture line, the fracture may move away from this line, thus resulting in scrapping or rejection of already completed pieces.

The latter is particularly harmful because the pieces to be rejected have reached the final step of processing and carry components which in some cases are particularly expensive.

OBJECT OF THE INVENTION

It is an object of the invention to provide an apparatus which will make possible the separating of the elements of the ceramic platelets of circuits in an automatic manner and with the certainty of not causing damage to the pieces themselves, by producing the fractures exactly along the incision lines intended for this purpose.

SUMMARY OF THE INVENTION

These objects and others are achieved by the present invention, which provides an apparatus for the automatic separation along predetermined bending fracture lines in basic ceramic platelets of hybrid electronic circuits. The apparatus comprises a support plate, provided on its lower face with grooves extending into close proximity with its upper face, these grooves defining bending lines and being arranged in correspondence with the bending fracture lines of a ceramic platelet placed in a register on the support plate and respective bays or squares of the plate, rigid in bending and corresponding to single elements into which the platelet is to be subdivided, upper pressing members adapted for clamping each element of the platelet against the corresponding bay of the plate rigidly supported in correspondence with a respective bay, lower opposing members acting against each of the remaining bays, the latter being retractable on command in a predetermined sequence, so that the successive bending of the plate along the lines defined by the grooves of said plate is determined under the action of the upper pressing members, and the fracture of the ceramic platelet along the predetermined lines coincides with the grooves of the plate.

The support plate may be composed of a plate of plastic materials of large thickness and provided with notches defining flexible diaphragms in the material itself along the predetermined bending lines for the plate or, alternatively, the support plate may be composed of a flexible thin sheet underneath which there are rigidly attached bays or squares, made of a material rigid in bending and separated from one another by grooves corresponding to intended bending lines of the plate.

The upper pressing members are composed of thrust members carried by a common frame, the frame is movable by an actuator means between a position of engagement of the pressing members with the platelet and a position corresponding to a disengagement thereof with the platelet.

Advantageously, each of the pressing members comprises an elastic pressure element and a controllable retraction actuator.

The grooves of the lower surface of the plate are composed basically of inverted V-section notches, having respective apexes in proximity to the upper face of the plate.

The lower opposing members acting against the free bays of the plate are composed of actuators controllable according to a predetermined sequence by a programmable control unit. Alternatively, the lower opposing members acting against the free bays of the plate are composed of cams having one or more lobes and carried by associated therewith parallel shafts actuated by a single common motor. Cams have lobes arranged in a mutally angular relationship determining the bending of the bays of the plate along the lines defined by the grooves according to a predetermined pattern.

Between the ceramic platelets and the plate there is a thin flexible conveyor belt for conveying the platelets above the plate.

The lower opposing members and the upper pressing members may be arranged according to a fixed grid, with a distance between two adjacent members equal to or less than the minimum dimension of the elements of the ceramic platelet and of the corresponding bays of the plate, at least one of the pressing members and of the actuators being in contact respectively with each element of the ceramic platelet and each bay of the plate.

BRIEF DESCRIPTION OF THE DRAWING

The above and other details will become more readily apparent from the following description, references being made to the accompanying drawings in which:

FIG. 1 shows the hybrid electronic circuits produced in several contiguous elements 1a, 1b, 1c on one single platelet 2 of ceramic material. Between adjacent elements there is a fracture line 3, having a localized weakening of the ceramic material of the platelet, produced, for example, by a laser incision of a series of adjacent holes, not passing through in the platelet and aligned along the desired line.

Figure 1:
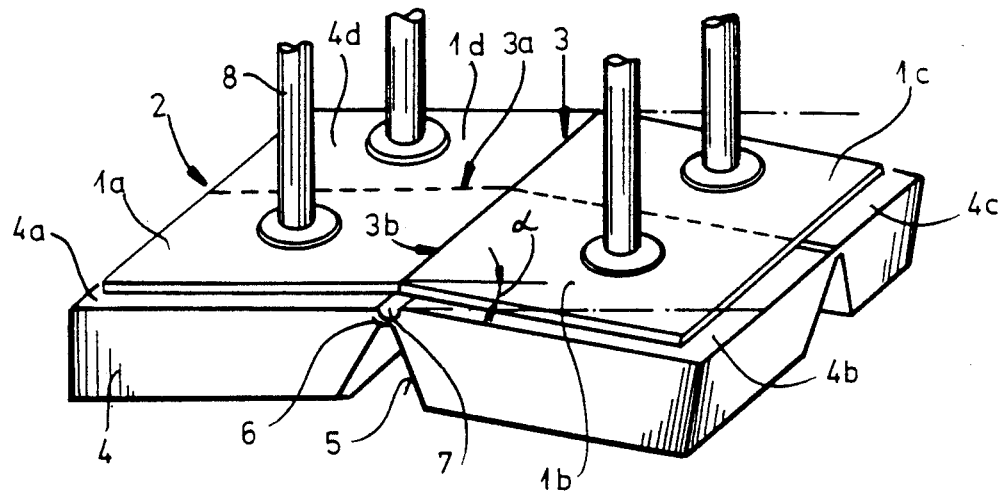
FIG. 1 is a schematic perspective view of an apparatus according to this invention in the phase of fracturing a platelet for hybrid circuits.

The bending of the ceramic platelet along the line 3 at an angle $\alpha$ of a few degrees causes breakage of the ceramic material, thereby separating the various circuits produced on the common platelet 2.

The apparatus according to this invention comprises a support plate 4 made of a plastic material, having an appreciable thickness so as to make it substantially rigid. The plate is provided with grooves 5 incised in its lower face and has a substantially inverted V-section, extending through a major part of the thickness of the plate, so as to leave a thin diaphragm 6 near the upper face of the plate juxtaposed with a discharge groove 7 formed on the same upper surface.

The grooves 5 are disposed along the fracture lines 3 intended for the platelet and define preferential folding lines for the plate 4, resulting from the flexibility of the diaphragm 6.

The plate 4 is subdivided by the grooves 5 and by the corresponding discharge grooves 7 into several bays or squares 4a, 4b, 4c, 4d and so on, which correspond to the respective single elements 1a, 1b, 1c, 1d of the platelet 2; one of the bays or squares is rigidly secured to a fixed support, while the other bays are supported below, in alignment with the fixed bay, by supports which can be moved under control.

The movable supports may have various forms of embodiment, as illustrated below.

Above the plate 4, there are several pressing members 8, for example, springs or pneumatic or similar actuators, disposed in correspondence with each of the bays 4a, 4b, 4c, 4d and adapted for pressing the ceramic platelet 2 against the plate 4, with the respective elements 1a, 1b, 1c, 1d in register with the bays 4a, 4b, 4c, 4d.

The ceramic platelet 2, with the associated incisions 3a, 3b constituting the predetermined fracture lines, is clamped by the pressing members 8 against the plate 4, the latter is held with its upper flat surface by the associated movable lower supports. Threafter, the lower supports of the plate 4 associated with the bays aligned along one row, for example, in FIG. 1 the bays 4b and 4c, are lowered by a command; under the thrust of the upper pressing members 8, the plate 4 bends along the line defined by the groove 5 forming the boundary of the row of bays, and the platelet 2, clamped against the plate by the pressing members, is also subjected to bending, which causes it to fracture along the corresponding incision line 3b.

The supports of the plate 4 are then again raised, bringing the plate back into a plane, and the supports of another row of aligned bays are then lowered, for example the bays 4a, 4b; under the action of the pressing members 8, bending of the plate 4 now takes place, inclining the bays 4a, 4b, and fracture of the ceramic platelet 2 now takes place along the incision line 3a.

In the embodiment illustrated in FIG. 1 successive operations therefore lead to separation from one another of all the elements of the platelet. If the ceramic platelet 2 comprises a greater number of elements, further cycles of bending will be necessary to effect the complete separation of all the elements.

The platelet, during the flexures which lead to fracture along the predetermined lines, is completely supported by conveying means allowing the platelet to be guided, thereby preventing the fracture from not being accurate, for various reasons, along the line defined by the incision.

Figure 2:
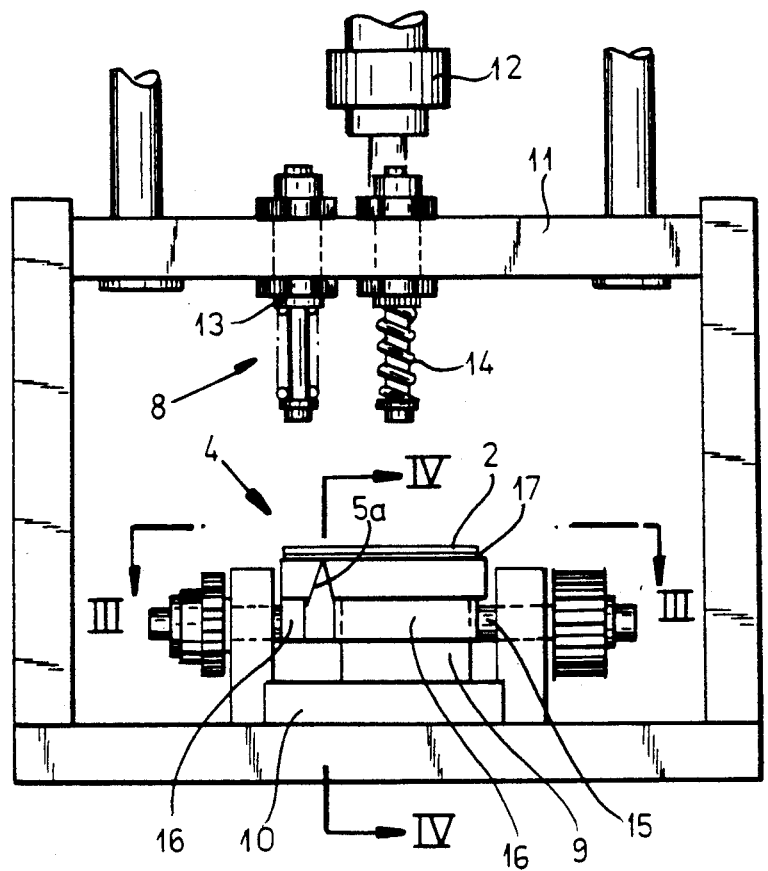
FIG. 2 is a front elevational view of another embodiment according to the invention.
Figure 3:
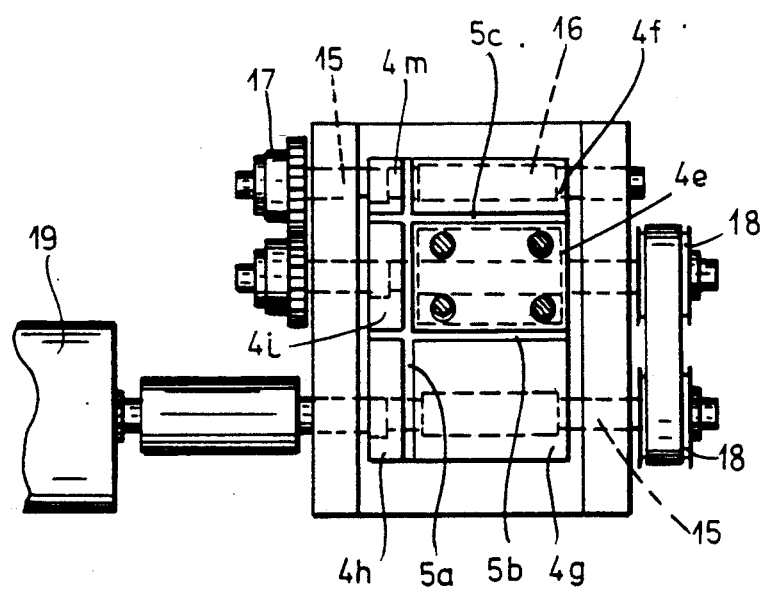
FIG. 3 is a section taken along lines III—III in FIG. 2.
Figure 4:
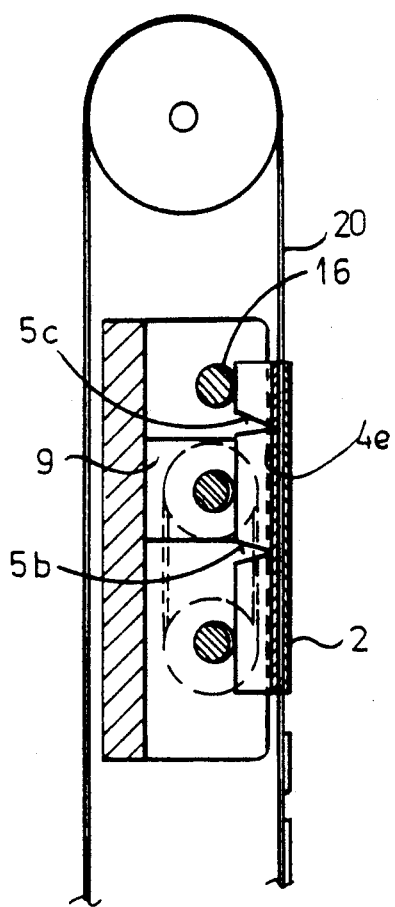
FIG. 4 is a section taken along lines IV—IV in FIG. 2.
Figure 7:
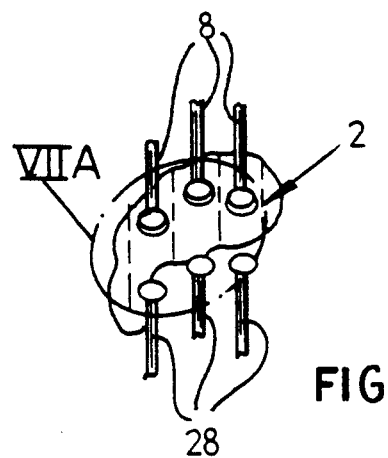
FIG. 7 is a grid configuration of opposing pressing and retractable members according to the invention.
Figure 7A:
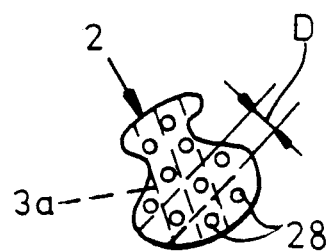
FIG. 7A is a highly diagrammatical grid configuration of retractable members according to FIG. 7.

In FIGS. 2 to 4 another embodiment of the apparatus according to this invention is illustrated.

As FIG. 2 shows, the plate 4 is supported by a fixed support 9 on a base 10; above it there is present a movable frame 11, equipped with an associated actuator 12, which carries the pressing members 8, composed of pneumatic actuators 13, the rods of which are biased downwards by prestressed springs 14.

It would be possible, however, to arrange a simultaneous actuation of elements 8 in accordance with controlling means.

The fixed support 9 is attached to a single bay 4e of the plate 4; the remaining bays 4f, 4g, 4h, 4i, 4m are supported by shafts 15, equipped with associated cams 16, connected together by gears 17 and toothed pulleys 18, which guarantee reciprocal angular correspondence to them; one of the shafts 15 is actuated by an associated motor 19.

The platelet 2 is carried above the plate 4 by means of a thin belt conveyor 20, sufficiently flexible not to influence the bending of the bays of the plate 4.

When the belt 20 has brought the platelet 2 above the plate 4, into a position defined by appropriate registering devices, not shown here, the frame 11 is lowered by the actuator 12 until the platelet 2 is clamped by the pressing members 8 against the plate, thus compressing the springs 14. In this phase, the cams 16 are all disposed in such a manner as to support the bays of the plate 4, resting upon them, in a horizontal position.

The motor 19 then causes rotation of the shafts 15 and of the associated cams 16; these cams are arranged in such a way that, during the course of one complete rotation of the motor 19, they first lower the support of the bays 4h, 4i, 4m, thus causing bending of the plate 4 along the line defined by the relative groove 5a, thus separating the corresponding elements from the remaining platelet 2.

The actuators 13 associated with the bays then retract their rods, thus coming into a position which no longer interferes with the separated platelet elements, while the further rotation of the shafts 15 brings the cams 16 into a position such as to restore the horizontal plane of the upper surface of the plate 4.

A further rotation of the shafts 15 brings the cams 16 into a position, which permits the downward deflection, under the action of the springs 14 of the pressing members again acting on the platelet 2, of the bays aligned along two other rows, transversely to the preceding row, that is to say of the bays 4g and 4h for one row and 4f and 4m for the other row, thus allowing the platelet 2 to fracture along two further incision lines, defined respectively by the grooves 5b and 5c.

The rods of the actuators are now all retracted, thus freeing the separated elements from the ceramic platelet, which elements can now be removed by the belt 20 to the discharge point or for further processing.

Figure 5:
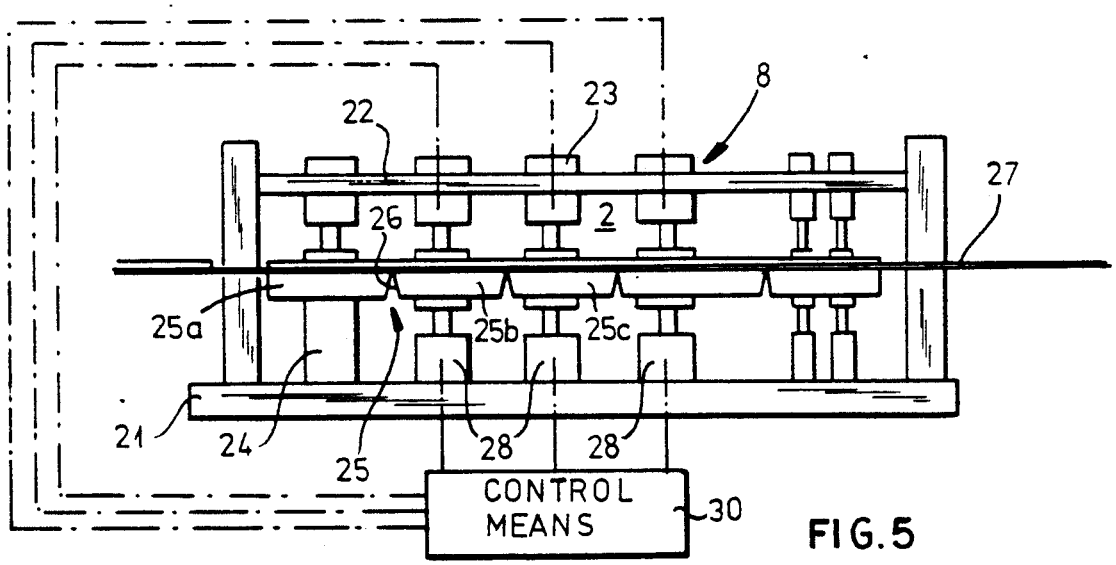
FIG. 5 is a third embodiment of the apparatus according to the present invention.

In FIG. 5 there is illustrated an alternative embodiment of the invention, in which there is a base 21 which carries a movable upper frame 22, to which there are attached several pressing members 8, provided with of controllable actuators 23, for example of pneumatic type; the base 21 carries a support 24, to which there is attached a bay 25a of a plate 25 made of the plastic material of considerable thickness and equipped with grooves 26 which define bending lines defining bays, in correspondence with the fracture lines intended for the ceramic platelet 2 to be subdivided, this ceramic platelet being conducted over the plate 25 by a flexible thin belt 27.

In correspondence with the other bays 25b, 25c etc. of the plate 25, there are present at least an equivalent number of controllable actuators 28 which, in the extended position, keep the plate 25 with its upper surface plane, with a function analogous to that of the cams of the preceding example.

Figure 6:
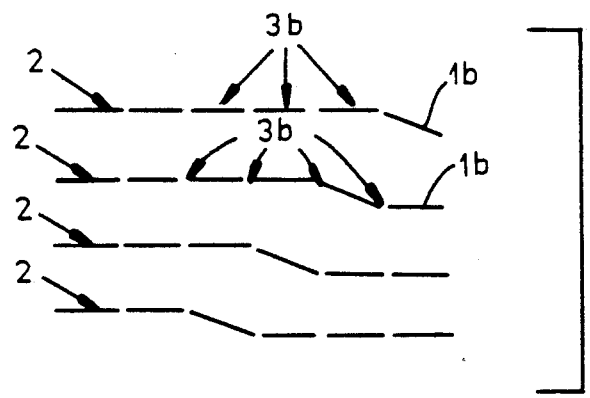
FIG. 6 is a possible arrangement of successive fractures of a platelet forming several rows of circuits.

The actuators 28 are controlled by a control unit 30, advantageously of programmable type, by means of which a succession of lowerings of the actuators themselves is defined, for example, as indicated schematically in FIG. 6 showing subdividing of the platelet into a plurality of single elements according to a signal received from the control unit 30 by simply selectively retracting lower members 28 regardless of either the upper members pressing simultaneously or according to another signal received from the control unit 30 manipulating the upper members 8, or according to analogous schemes, depending upon the topology of the fractures to be produced, as a result of which the flexures of the plate 25 are carried out, which lead to the separation of all the elements of the remaining platelet 2 clamped by the pressing memebers 8, in analogous manner to the above described embodiment.

The upper pressing members 8 and the lower controllable actuators 28 may be of small dimensions and may be arranged at close spacings; in this way it is possible to adapt the apparatus to different arrangements of the fracture lines of the platelets and to different dimensions of the platelets themselves and of their individual elements, by replacing for each type of platelet only the plate 25 with an arrangement of grooves disposed according to the fracture lines intended for the platelet in question.

In the case where the dimensions of the single platelet elements, and therefore of the single bays of the plate 25, are greater than those defined by the relevant distance between two contiguous actuators, each bay or some of the bays may rest upon two or more actuators, which will in this case be actuated in an integral manner, as illustrated in the right-hand side of FIG. 5.

The apparatus, therefore, makes it possible to use the same production line for different products, by simply changing the support plate, which supports the platelet along the desired fracture lines, and the programming sequence of the movements of the lower actuators.

Figure 8:
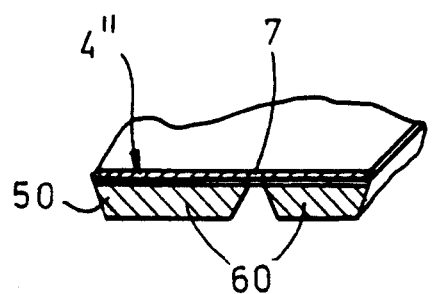
FIG. 8 is an alternative embodiment of the apparatus showing a thin support plate with bays attached thereto.

According to FIG. 8 the plate 4, in an alternative form of embodiment, may also be made up in a composite manner of an upper flexible sheet, for example of steel of small thickness 4", beneath which there are secured by welding 50, gluing or the like, the rigid bays 60, for example of metal, separated from one another by grooves 7" along the intended flexure lines.

Numerous variants can be introduced, without, however, departing from the scope of the invention in its general characteristics.

I claim:

1. An apparatus for automatically subdividing a basic ceramic platelet of hybrid electronic circuits into a plurality of single elements along a plurality of predetermined bending-fracture lines of said platelet, said apparatus comprising:

a support plate having a lower face and an upper face spaced from said lower face and parallel thereto, said upper face being juxtaposed with the ceramic platelet, said lower face being provided with:

a plurality of intersecting grooves open at and traversing said lower face, said grooves extending upwardly toward said upper face but terminating at a distance therefrom, said grooves forming boundaries defining a plurality of bays of said plate therebetween and defining bending lines connecting said bays and being in registry with the fracture lines of the platelet, said bays being rigid upon a successive bending of said support plate along said bending lines;

means juxtaposed with said upper face of the plate for pressing each of the plurality of single elements to be separated against the respective bay of said plate;

a fixed support juxtaposed with said lower face of the plate and being in a continuous contact with one of said bays;

a plurality of retractable members facing said lower face of the plate and acting against others of said bays; and means for controlling the retraction of said retractable members in a predetermined sequence upon the successive bending of said plate and the platelet by said means for pressing along said bending lines, so that the ceramic platelet is subdivided in the plurality of single elements along the fracture lines of the platelet.

2. The apparatus defined in claim 1 wherein said upper face of said support plate is provided with a plurality of notches juxtaposed with said grooves and extending along said bending lines of said plate, each of said notches and the respective groove defining a respective diaphragm therebetween in said plate.

3. The apparatus defined in claim 1 wherein said support plate is a thick plastic plate.

4. The apparatus defined in claim 1, further comprising a frame carrying said means for pressing said platelet, said means for pressing being a plurality of thrust members opposing said retractable members.

5. The apparatus defined in claim 4 wherein said thrust members are movable between a position of engagement thereof with the platelet and a position of disengagement of said thrust members with the platelet.

6. The apparatus defined in claim 4 wherein each of said thrust members comprises an elastic pressure element and a controllable retraction actuator.

7. The apparatus defined in claim 1 wherein said retractable members are disposed according to a fixed grid pattern having a pitch, each of said single elements to be separated having generally a rectangular cross-section and having a minimum dimension thereof, said pitch being at most equal to said minimum dimension of each of the single elements of the platelet.

8. The apparatus defined in claim 1 wherein each of said grooves has an apex located close to said upper face of the plate.

9. The apparatus defined in claim 1, further comprising means for conveying the platelet above said support plate, said means for conveying bein interposed between said plate and the platelet.

10. The apparatus defined in claim 1 wherein said plurality of retractable members include a plurality of shafts rotatable about respective parallel axes of rotation and supporting respective bays, said shafts being provided with respective cam mechanisms formed with at least one lobe carried by the respective shaft, said cams having a predetermined angular relationship therebetween and causing the bending of the bays of said support plate resulting in subdividing the platelet in the plurality of single elements along the fracture lines according to a sequence defined by said means for controlling.

11. The apparatus defined in claim 10 wherein said shafts are actuated by a common motor.

12. The apparatus defined in claim 1 wherein said support plate includes a flexible thin sheet, said bays being rigid and supporting said sheet upon bending of said sheet.

* * * * *